United States Patent [19]

Kawabe et al.

[11] Patent Number: 4,546,537
[45] Date of Patent: Oct. 15, 1985

[54] METHOD FOR PRODUCING A SEMICONDUCTOR DEVICE UTILIZING V-GROOVE ETCHING AND THERMAL OXIDATION

[75] Inventors: Yunosuke Kawabe; Yoshinobu Momma, both of Kitakami, Japan

[73] Assignee: Fujitsu Limited, Kawasaki, Japan

[21] Appl. No.: 578,592

[22] Filed: Feb. 10, 1984

Related U.S. Application Data

[63] Continuation of Ser. No. 150,685, May 16, 1980, abandoned.

[30] Foreign Application Priority Data

May 18, 1979 [JP] Japan .................... 54-61229

[51] Int. Cl.³ .................... H01L 21/302; H01L 21/76
[52] U.S. Cl. .................... 29/576 W; 29/578; 29/580; 148/175; 148/187; 148/DIG. 85; 148/DIG. 117; 156/647; 156/648; 156/649; 357/50; 357/52; 357/55
[58] Field of Search .................... 29/576 W, 578, 580; 148/175, 187; 156/647, 648, 649; 357/50, 52, 55

[56] References Cited

U.S. PATENT DOCUMENTS

| | | | |
|---|---|---|---|
| 3,873,383 | 3/1975 | Kooi | 148/187 |
| 3,933,540 | 1/1976 | Kondo et al. | 148/175 X |
| 4,008,107 | 2/1977 | Hayasaka et al. | 29/578 X |
| 4,026,736 | 5/1977 | Lesk | 148/175 X |
| 4,137,109 | 1/1979 | Aiken et al. | 29/578 X |
| 4,231,057 | 10/1980 | Momma et al. | 148/175 X |
| 4,255,207 | 3/1981 | Nicolay et al. | 29/576 W |

Primary Examiner—William G. Saba
Attorney, Agent, or Firm—Staas & Halsey

[57] ABSTRACT

In a semiconductor device comprising at least one bipolar transistor and a VIP isolating layer which are formed in both an epitaxial layer and a semiconductor substrate, an impurity-introduced region having the same conductivity type as that of the semiconductor substrate is formed so as to surround the V-groove. A buried layer of the bipolar transistor comes into contact with the VIP isolating layer to divide the impurity-introduced region into two parts, one of which is combined with a base region and the other one of which serves as a channel stopper.

3 Claims, 9 Drawing Figures

METHOD FOR PRODUCING A SEMICONDUCTOR DEVICE UTILIZING V-GROOVE ETCHING AND THERMAL OXIDATION

This application is a continuation of application Ser. No. 150,685, filed May 16, 1980, now abandoned.

BACKGROUND OF THE INVENTION

1. Field of the Invention

The present invention relates to semiconductor devices and a method for producing the semiconductor devices, and more particularly, to a semiconductor device comprising at least one bipolar transistor and an isolating region, e.g. a so-called VIP (V-groove isolation polycrystalline silicon backfill) isolating layer for isolating the bipolar transistor from other elements.

2. Description of the Prior Art

A known combination of a bipolar transistor with a VIP isolating layer for semiconductor devices, e.g. IC and LSI, is illustrated in FIG. 1. In FIG. 1, the bipolar transistor (in this case, this transistor is an npn type bipolar transistor) comprises an n-type collector region 1, a p-type base region 2 and an n-type emitter region 3 which are formed in an n-type epitaxial layer 4 grown on a p-type semiconductor substrate 5. The transistor, moreover, has an n+-type buried layer 6 and an n+-type region 7 for electrical contact. The bipolar transistor is surrounded by the VIP isolating layer so that the bipolar transistor is isolated from other elements of the semiconductor device. The VIP isolating layer comprises an insulator layer 8 formed on a side surface of a V-groove 9, a polycrystalline silicon layer 10 filling the inside space of the V-shaped insulator layer 8 and a relatively thick insulating layer 11. The bottom peak of the V-groove 9 enters the semiconductor substrate 5 through the epitaxial layer 4. It is preferable to form a p+-type buried layer 12, which surrounds the V-groove 9 and serves as a channel stopper, in the upper portion of the semiconductor substrate 5.

The above-mentioned npn type bipolar transistor with the VIP isolating layer is produced in the following manner. The starting material is the p-type semiconductor substrate 5, e.g. a silicon single-crystal wafer. The n+-type buried layer 6 is selectively formed in the upper portion of the semiconductor substrate 5 by a thermal diffusion process or an ion implantation process. The p+-type buried layer 12 is selectively formed in the upper portion of the semiconductor substrate 5 so as to surround the n+-type buried layer 6 by a thermal diffusion or an ion implantation process. In a case where the ion implantation process is carried out, the semiconductor substrate 5 with the buried layers 6 and 12 is annealed. Then, the n-type semiconductor (e.g. silicon) epitaxial layer 4 is formed on the semiconductor substrate 5 by a conventional epitaxial growth technique.

An insulating layer 13 (e.g. a silicon dioxide layer) is formed on the epitaxial layer 4 by a thermal oxidation process. In FIG. 1, the reference numeral 13 indicates portions of the insulating layer. An oxidation masking layer (e.g. a silicon nitride layer, not shown) is formed on the insulating layer 13 by a chemical vapor deposition (CVD) process. Then, the oxidation masking layer and the insulating layer 13 are selectively etched by a conventional photolithography technique to form a predetermined opening (not shown). Using the oxidation masking layer and insulating layer 13 as a mask, the V-groove 9 is formed in both the epitaxial layer 4 and the semiconductor substrate 5 by anisotropically etching them with a suitable etchant. The bottom peak of the V-groove 9 enters the semiconductor substrate 5 through the p+-type buried layer 12, as illustrated in FIG. 1.

The insulator layer 8 (e.g. a silicon dioxide layer) is formed on the surface of the V-groove 9 by a thermal oxidation process. A polycrystalline silicon layer is formed on the surfaces of the oxidation masking layer and the insulator layer 8 and, then, is polished to remove all except the portion 10 of it which remains within the V-groove. The remaining polycrystalline silicon layer 10 is thermally oxidized to form a relatively thick insulating layer 11 (i.e. a silicon dioxide layer), as illustrated in FIG. 1.

The P-type base region 2, a portion of which comes into contact with the insulator layer 8, is formed in the n-type collector region 1 of the epitaxial layer 4 by an ion implantation process. The n+-type emitter region 3, a portion of which comes into contact with the insulator layer 8, is formed in the base region 2 and, simultaneously, the n+-type region 7 for electrical contact is formed in the collector region 1 by an ion implantation process. It should be noted that it is possible to form the regions 2 and 3 by a thermal diffusion process instead of the ion implatation process. After the ion implantation process, and annealing treatment for the base region 2 and emitter region 3 is carried out. The insulating layer, except for the portion 13, is removed by a photolithography technique to expose the surface portions of the epitaxial layer 4. Finally, metal (e.g. aluminum) electrodes 14, 15 and 16 are formed so as to come into contact with the exposed surface portions of the epitaxial layer 4, as illustrated in FIG. 1, by a suitable technique for forming patterned metal layers.

The above-mentioned bipolar transistor with the VIP isolating layer has the advantage that dimensions of the bipolar transistor are small and, accordingly, the degree of integration of an IC or LSI is high, since the portions of the base region and the emitter region come into contact with the VIP isolating layer, i.e. the insulator layer in the V-groove. However, as shown in FIG. 2a, a so-called bird's beak 17 of silicon dioxide is inevitably formed at a joining portion of the insulating layer 13 and the relatively thick insulating layer 11, when the thick insulating layer 11 is formed by a thermal oxidation process.

The ion implantation process for forming the base region 2 (FIG. 2a) and the emitter region 3 (FIG. 2b) will now be explained in more detail. Using a patterned photo resist 18 as a mask, p-type impurities (e.g. boron, aluminum or gallium) are introduced into the epitaxial layer 4 by ion implantation to form the base region 2. In this case, since the impurities are introduced at various depths, in accordance with a profile of the bird's beak 17, the bottom face of a portion of the base region 2 located under the bird's beak 17 gradually becomes tapered upward, as illustrated in FIG. 2a. The photo resist 18 is removed and then the insulating layer 13 is etched to form an opening 19 (FIG. 2b) by photolithography. When the etching is performed, the etchant (e.g. HF solution) etches not only the insulating layer 13 but, also, the bird's beak 17 and a side portion of the thick insulating layer 11, as illustrated in FIG. 2b. N-type impurities (e.g. phosphorus, arsenic or antimony) are introduced through the opening 19 into the base region 2 by ion implantation to form the emitter region 3. The bottom face of the emitter region 3 is flat, so that the end of the tapered portion of the base region 2 either comes into contact with the emitter region 3 near the insulator layer 8 within the V-groove 9, as illustrated in FIG. 2b, or approaches the emitter region 3, but does not quit contact it (in this case, not shown).

If the bottom face of the base region 2 comes into contact with that of the emitter region 3, a short-circuit between the collector and the emitter will occur. Furthermore, as the bottom face of the base region 2 approches that of the emitter region 3, the breakdown voltage between the collector and the emitter decreases. In a case where the above-mentioned bipolar transistors are used in a high speed IC or LSI, those transitors have a thinner base thickness than an ordinary bipolar transistor, so that disadvantages, such as the above-mentioned short-circuit and decrease of the breakdown voltage, occur frequently in the bipolar transistors in the high speed IC or LSI.

SUMMARY OF THE INVENTION

It is an object of the present invention to prevent the above-described short-circuit and decrease of breakdown voltage from occurring by providing an improved semiconductor device comprising at least one bipolar transistor with a VIP isolating layer.

It is another object of the present invention to provide a method for producing an improved semiconductor device comprising at least one bipolar transistor with a VIP isolating layer.

The above-mentioned objects and other objects of the present invention are attained by providing a semiconductor device comprising at least one bipolar transistor and a VIP isolating layer which are formed in both an epitaxial layer and a semiconductor substrate, with an emitter region of the bipolar transistor coming into contact with the VIP isolating layer, wherein the semiconductor device is characterized in that an inpurity-introduced region, having the same conductivity type as that of the semiconductor substrate, is formed, so as to surround a V-groove of the VIP isolating layer and to combine with a base region of the bipolar transistor, and that a buried layer of the bipolar transistor comes into contact with the VIP isolating layer.

It is desirable that a portion of the impurity—introduced region, which portion surrounds the bottom peak of the V-groove, serve as a channel stopper.

According to the present invention, a method for producing the improved semiconductor device comprising at least one bipolar transistor and the VIP isolating layer, which are formed in both the epitaxial layer and semiconductor substrate comprises the steps of forming the buried layer in the entire upper portion of the semiconductor substrate prior to the formation of the epitaxial layer, and introducing impurities having the same conductivity type as that of the semiconductor substrate into the exposed portions of the epitaxial layer and the semiconductor substrate in the V-groove subsequent to the formation of the V-groove of the VIP isolating layer.

DESCRIPTION OF THE PREFERRED EMBODIMENT

Figure 3A:
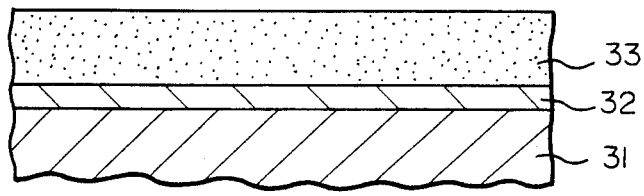
FIG. 3a through 3f are schematic sectional views of a part of a semiconductor device in various stages of production in accordance with the method of the present invention.

Referring now to FIG. 3a, the starting material is a semiconductor substrate 31 of one conductivity type, in this case p-type. The semiconductor substrate 31 may be a single-crystall silicon wafer, e.g. a p-type (100) oriented silicon wafer. N-type impurities such as arsenic (As) are introduced into the entire upper portion of the semiconductor substrate 31 to form a n$^+$-type buried layer 32 by a conventional ion implantation process and a suitable annealing treatment. For example, an impurity concentration of the buried layer 32 is approximately $1 \times 10^{20}$ atoms/cm$^3$. It should be noted that it is also is possible to form buried layer 32 by a conventional thermal impurity diffusion process. An n-type epitaxial layer 33 of silicon is formed on the buried layer 32 of the semiconductor substrate 31 by a conventional vapor epitaxial growth technique. The grown epitaxial layer 33 has an impurity concentration of $1 \times 10^{16}$ atoms/cm$^3$ and is oriented in the same direction as that of the semiconductor substrate 31.

Figure 3B:
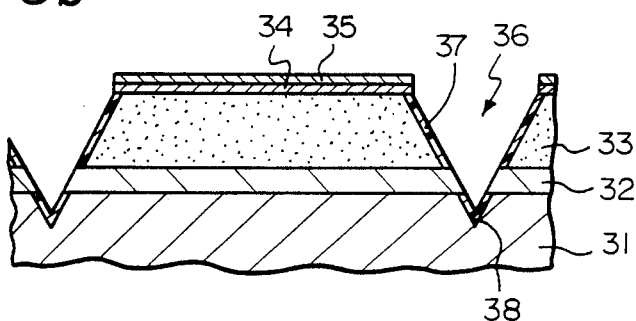

An insulating layer 34 (FIG. 3b) e.g. a silicon dioxide layer having a thickness of 100 nm, is formed on the epitaxial layer 33 by thermally oxidizing the epitaxial layer 33. An oxidation masking layer 35, e.g. a silicon nitride layer having a thickness of 200 nm, is formed on the insulating layer 34 by a conventional chemical vapor deposition process. Then, the oxidation masking layer 35 and the insulating layer 34 are selectively etched by a photolithography technique to form a predetermined opening. Using the oxidation masking layer 35 and the insulating layer 34 as a mask, portions of the epitaxial layer 33 and the semiconductor substrate 31 are anisotropically etched through the opening by an etchant of aqueous solution of potassium hydroxide and isopropyl alcohol to form a V-groove 36, as illustrated in FIG. 3b. The bottom peak of the V-groove 36 enters the semiconductor substrate 31 through the n$^+$-type buried layer 32. Then, using the oxidation masking film 35 and the insulating layer 34 as a mask, p-type impurities, such as boron (B), are introduced into the exposed portions of the epitaxial layer 33 and the semiconductor substrate 31 in the V-groove 36 by thermal diffusion. It should be noted that it is also possible to introduce the impurities by an ion implantation process instead of the thermal diffusion process. By introducing the p-type impurities, p-type regions 37 and 38 are formed in the epitaxial layer 33 and the semiconductor substrate 31, respectively, as illustrated in FIG. 3b. Since the impurity concentration of the p-type regions 37 and 38 is approximately $1 \times 10^{18}$ atoms/cm$^3$, the conductivity type of the buried layer 32 is not reversed. The p-type region 38 surrounding the bottom peak of the V-groove 36 serves as a channel stopper.

Figure 3C:
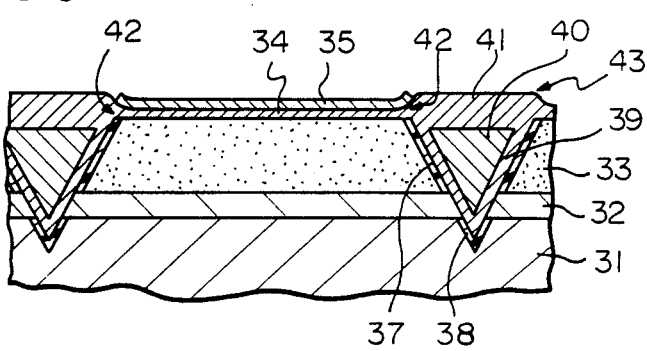

An insulator layer 39 (FIG. 3c) of silicon dioxide is formed on the surface of the V-groove 36 by thermally oxidizing the exposed portions of the epitaxial layer 33 and the semiconductor substrate 31 in the V-groove 36. A polycrystalline silicon layer is formed on all of the exposed surfaces of the oxidation masking layer 35 and the insulator layer 39, so as to fill V-groove 36 by chemical vapor deposition. The polycrystalline silicon layer, except for a portion 40 lying in the V-groove 36, is removed by polishing to expose the oxidation masking layer 35. Then, a thick insulating layer 41 of silicon dioxide is formed on the remaining polycrystalline silicon layer 40 by thermal oxidation. During this thermal oxidation process, so-called bird's beaks 42 of silicon dioxide are inevitably formed, as illustrated in FIG. 3c. In the above-described manner, the VIP isolating layer 43 is completed.

Figure 1:
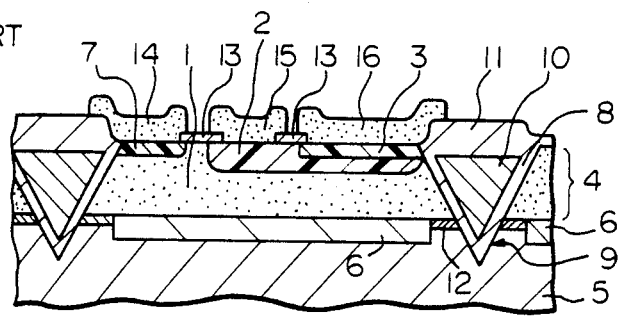
FIG. 1 is a schematic sectional view of a part of a semiconductor device comprising at least one bipolar transistor and a VIP isolating layer, according to the prior art.
Figure 2A:
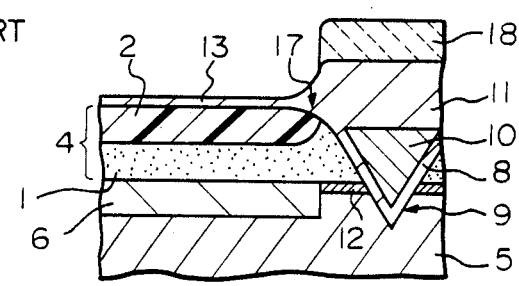
FIG. 2a is a schematic sectional view of a part of the semiconductor device of FIG. 1 at a stage of formation of the base region.
Figure 2B:
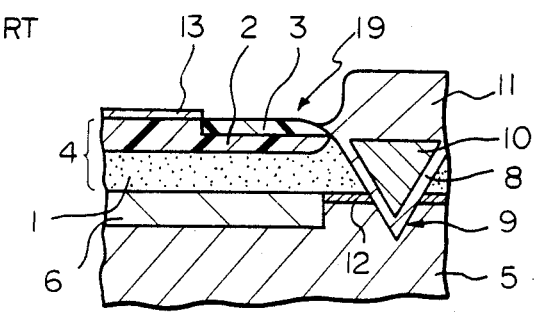
FIG. 2b is a schematic sectional view of a part the semiconductor device of FIG. 1 at a stage of formation of the emitter region.
Figure 3D:
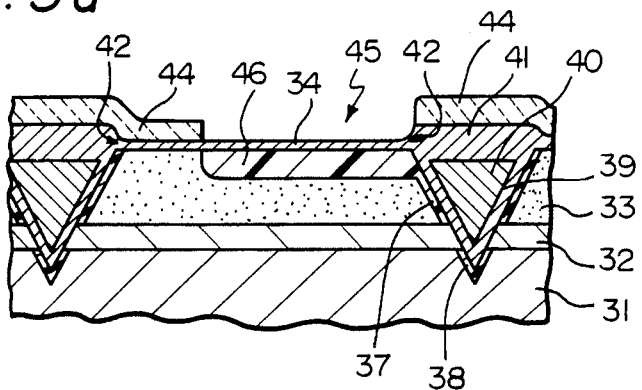

Next, the oxidation masking layer 35 is removed, as illustrated in FIG. 3d. Then, a photo resist 44 is formed on the insulating layers 34 and 41 and, then, is selectively etched to form predetermined opening 45. P-type impurities, such as boron, are introduced into the epitaxial layer 33 through the opening 45 by ion implantation to form a p+-type base region 46. Since the bird's beak 42 exists, it may be supposed that the bottom face of the base region 46 varies so as to become tapered upward under the bird's beak in the manner as illustrated in FIG. 2a. However, since the p-type region 37 has been formed, the p-type region 37 and the p+-type base region 46 are combined into one p-type region. Thus, though the bird's beak 42 exists, the bottom face of the base region 46 does not vary so as to become tapered upward under the bird's beak 42.

Figure 3E:
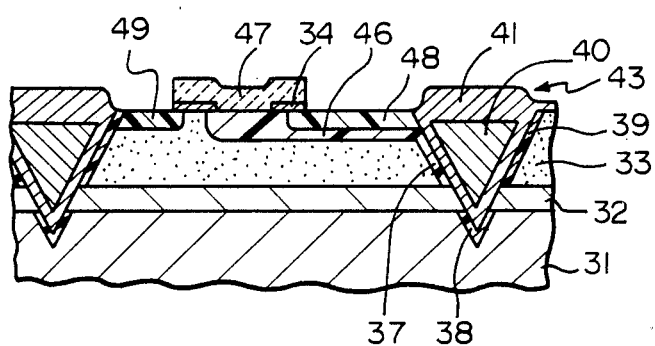

Next, the photo resist 44 is removed. The insulating layer 34 is then selectively etched by photolithography so as to expose predetermined portions of the surface of the epitaxial layer 33. When the etching is performed, not only the insulating layer 34 but also the bird's beak 42 and a side portion of the thick insulating layer 41 are etched, as illustrated in FIG. 3e. Then, another photo resist 47 is selectively formed to use as a mask in the formation of an emitter region 48 and an n+-type region 49 for electrical contact. N-type impurities, such as phosphorus, are introduced into the base region 46 and epitaxial layer 33 by ion implantation to form the emitter region 48, a portion of which comes into contact with the insulator layer 39, and the n+-type region 49, as illustrated in FIG. 3e.

Figure 3F:
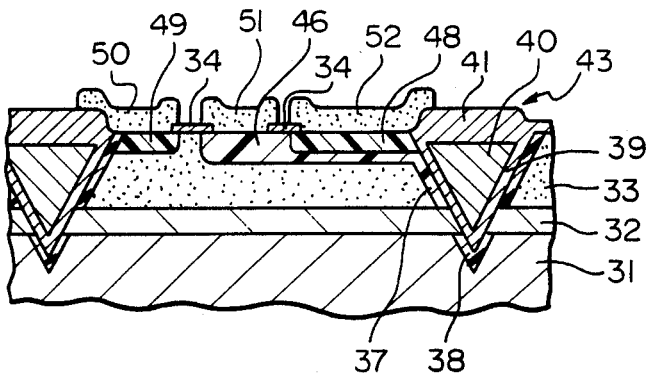

Next, the photo resist 47 is removed. Then, a metal, e.g. aluminum, layer is form on the entire surface of the semiconductor device, by a conventional vapor evaporation process, and is selectively etched by photolithography to form a collector electrode 50, a base electrode 51 and an emitter electrode 52, as illustrated in FIG. 3f. In the above-described manner, the semiconductor device of the present invention is completed.

In the completed semiconductor device the bottom face of the base region 46 does not come into contact with that of the emitter region 48, since the p+-type base region 46 and the p-type region 37 are combined. Moreover, the bottom face of the base region 46 does not approach that of the emitter region 48 near the insulating layer 39 in the V-groove 36. Therefore, a short-circuit between the collector and the emitter and a decrease of the breakdown voltage between the collector and the emitter do not occur. As the result, the reliability of the semiconductor device according to the present invention is high.

It will be obvious that the present invention is not restricted to the above-mentioned embodiment, and that many variations are possible for those skilled in the art without departing from the scope of the present invention. For example, the conductivity type of the semiconductor substrate, the base region and the impurity-introduced region surrounding the V-groove can be changed from p-type the n-type and that of the buried layer, the epitaxial layer (i.e. collector region) and the emitter region can be changed from n-type to p-type. That is, it is possible to produce an npn type bipolar transistor. It is also possible to form a U-shaped groove instead of the V-groove by etching the epitaxial layer and the semiconductor substrate with plasma or a hydrogen fluoride solution. Furthermore, it is possible to form the impurity-introduced region by introducing impurities having the opposite conductivity type to that of the epitaxial layer into a portion of the epitaxial layer and, then, etching a predetermined area of said portion of the epitaxial layer to form the V-groove. In this case, there is no region serving as a channel stopper around the bottom peak of the V-groove.

We claim:

1. A method for producing a semiconductor device which comprises at least one bipolar transistor and a VIP isolating layer which are formed in both an epitaxial layer and a semiconductor substrate, with an emitter region of said bipolar transistor coming into contact with said VIP isolating layer, comprising the steps of:

forming a buried layer in said semiconductor substrate having a first conductivity type, the buried layer having the opposite conductivity type;

forming said epitaxial layer having said opposite conductivity type on said semiconductor substrate;

forming a first insulating layer on said epitaxial layer;

forming an oxidation masking layer on said first insulating layer;

selectively etching said oxidation masking layer and said first insulating layer to form an opening;

anisotrophically etching said epitaxial layer and said semiconductor substrate through said opening to form a V-groove, the bottom peak of which enters said semiconductor substrate through said buried layer;

introducing impurities having said first conductivity type into exposed portions of said epitaxial layer and said semiconductor substrate in said V-groove;

selectively oxidizing said exposed portions in said V-groove to form a second insulating layer;

forming a polycrystalline silicon layer on said second insulating layer to fill said V-groove;

selectively oxidizing said polycrystalline silicon layer to form a relatively thick insulating layer of silicon dioxide including a bird's beak;

removing said oxidation masking layer;

forming a base region through a portion of said first insulating layer to have said first conductivity type in said epitaxial layer and in contact with said impurity-introduced region;

forming an emitter region having said opposite conductivity type in said base region and in contact with said relatively thick insulating layer;

forming an impurity-introduced region for electrical contact, having said opposite conductivity type, in said epitaxial layer outside of said base and emitter regions; and forming electrodes on portions of said base emitter and impurity-introduced regions for electrical contact.

2. The method of claim 1, said relatively thick insulating layer extending into said polycrystalline silicon layer to a level below the surface of said epitaxial layer in which said base and emitter regions are formed.

3. The method of claim 2, wherein poritons of said insulating layer remain in said device over said epitaxial layer.

* * * * *